US011570916B2

(12) United States Patent
Song

(10) Patent No.: US 11,570,916 B2
(45) Date of Patent: Jan. 31, 2023

(54) SERVER CASING ASSEMBLY

(71) Applicants: Inventec (Pudong) Technology Corporation, Shanghai (CN); INVENTEC CORPORATION, Taipei (TW)

(72) Inventor: Er-Zhen Song, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 107 days.

(21) Appl. No.: 17/194,443

(22) Filed: Mar. 8, 2021

(65) Prior Publication Data

US 2022/0232717 A1 Jul. 21, 2022

(30) Foreign Application Priority Data

Jan. 18, 2021 (CN) ......................... 202110062042.8

(51) Int. Cl.
*H05K 5/00* (2006.01)
*H05K 5/02* (2006.01)
*H05K 7/14* (2006.01)

(52) U.S. Cl.
CPC ......... *H05K 5/0221* (2013.01); *H05K 7/1488* (2013.01)

(58) Field of Classification Search
CPC .......... H05K 5/0221; H05K 5/00; H05K 5/03; H05K 7/1488; H05K 7/14; H05K 7/1427; H05K 7/16; H05K 7/1411; E05C 1/00; E05C 1/004; E05C 1/02; E05C 1/04; E05C 1/08; E05C 1/085; E05C 1/10; E05C 7/04; E05C 7/045; E05C 7/06; E05C 9/02; E05C 9/022
USPC ........................... 312/217, 223.1, 223.2, 333
See application file for complete search history.

(56) References Cited

U.S. PATENT DOCUMENTS 7,106,596 B1 * 9/2006 Reznikov ................ G06F 1/185 312/223.1
8,162,416 B2 * 4/2012 Green .................. E05B 65/463 312/333
2002/0153811 A1 * 10/2002 Kluser ................. H05K 7/1425 312/223.1

(Continued)

FOREIGN PATENT DOCUMENTS

CN 111601478 * 8/2020

OTHER PUBLICATIONS

English translation for CN111601478 (Year: 2020).*

*Primary Examiner* — Janet M Wilkens
(74) *Attorney, Agent, or Firm* — Locke Lord LLP; Tim Tingkang Xia, Esq.

(57) ABSTRACT

A server casing assembly includes a casing, a first cage, a second cage, and a latch. The casing has two accommodation spaces spaced apart from each other. The first cage and the second cage are respectively accommodated in the accommodation spaces. The latch is slidably disposed on the casing. The latch is movable between a first unlocked position and a second unlocked position. When the latch is in the first unlocked position, the latch is engaged with the second cage, and the first cage is released from the latch. When the latch is in the second unlocked position, the latch is engaged with the first cage, and the second cage is released from the latch.

9 Claims, 7 Drawing Sheets

1 111 2 112 122 12 121 122 D 2 111 20 112 50 10 30 11

(56) References Cited

U.S. PATENT DOCUMENTS

| | | | | |
|---|---|---|---|---|
| 2007/0205702 | A1* | 9/2007 | Hsu | G11B 33/12 |
| 2016/0014918 | A1* | 1/2016 | Kelaher | H05K 7/1487 312/319.1 |

* cited by examiner

SERVER CASING ASSEMBLY

CROSS-REFERENCE TO RELATED APPLICATIONS

This non-provisional application claims priority under 35 U.S.C. § 119(a) on Patent Application No(s). 202110062042.8 filed in China on Jan. 18, 2021, the entire contents of which are hereby incorporated by reference.

TECHNICAL FIELD OF THE INVENTION

The invention provides a server casing assembly, more particularly to a server casing assembly using a latch to prevent from unlocking two cages at the same time.

DESCRIPTION OF THE RELATED ART

A typical server has removable cages or trays for hard disk drives. The removal of the cage or tray from the server casing can take the hard disk drive out of the server along with it, allowing the following maintenance process of the hard disk drive.

Generally, each cage can accommodate more than one hard disk drive. In some types of servers, one cage at most may contain up to 21 hard disk drives, but when more than two cages are moved frontward, their changes of the center of gravity would likely cause the whole server to fall forwards. Therefore, how to improve the above problem is a crucial topic in the field.

SUMMARY OF THE INVENTION

The invention provides a server casing assembly that enables easy control of the removal of hard disks cage.

One embodiment of the invention provides a server casing assembly. The server casing assembly includes a casing, a first cage, a second cage, and a latch. The casing has two accommodation spaces spaced apart from each other. The first cage and the second cage are respectively accommodated in the accommodation spaces. The latch is slidably disposed on the casing. The latch is movable between a first unlocked position and a second unlocked position. When the latch is in the first unlocked position, the latch is engaged with the second cage, and the first cage is released from the latch. When the latch is in the second unlocked position, the latch is engaged with the first cage, and the second cage is released from the latch.

As the server casing assemblies discussed in the above embodiments, either the latch is in the first unlocked position or the second unlocked position, only one of the cages (the first cage and the second cage) is released but the other is still held in place, that is, the above arrangement prevents user from moving both the first cage and the second cage out of the casing at the same time, thereby preventing the whole server from falling forwards due to too much frontward motion of the overall center of gravity.

BRIEF DESCRIPTION OF THE DRAWINGS

The present invention will become better understood from the detailed description given herein below and the accompanying drawings which are given by way of illustration only and thus are not intending to limit the present invention and wherein.

DETAILED DESCRIPTION

Figure 1:
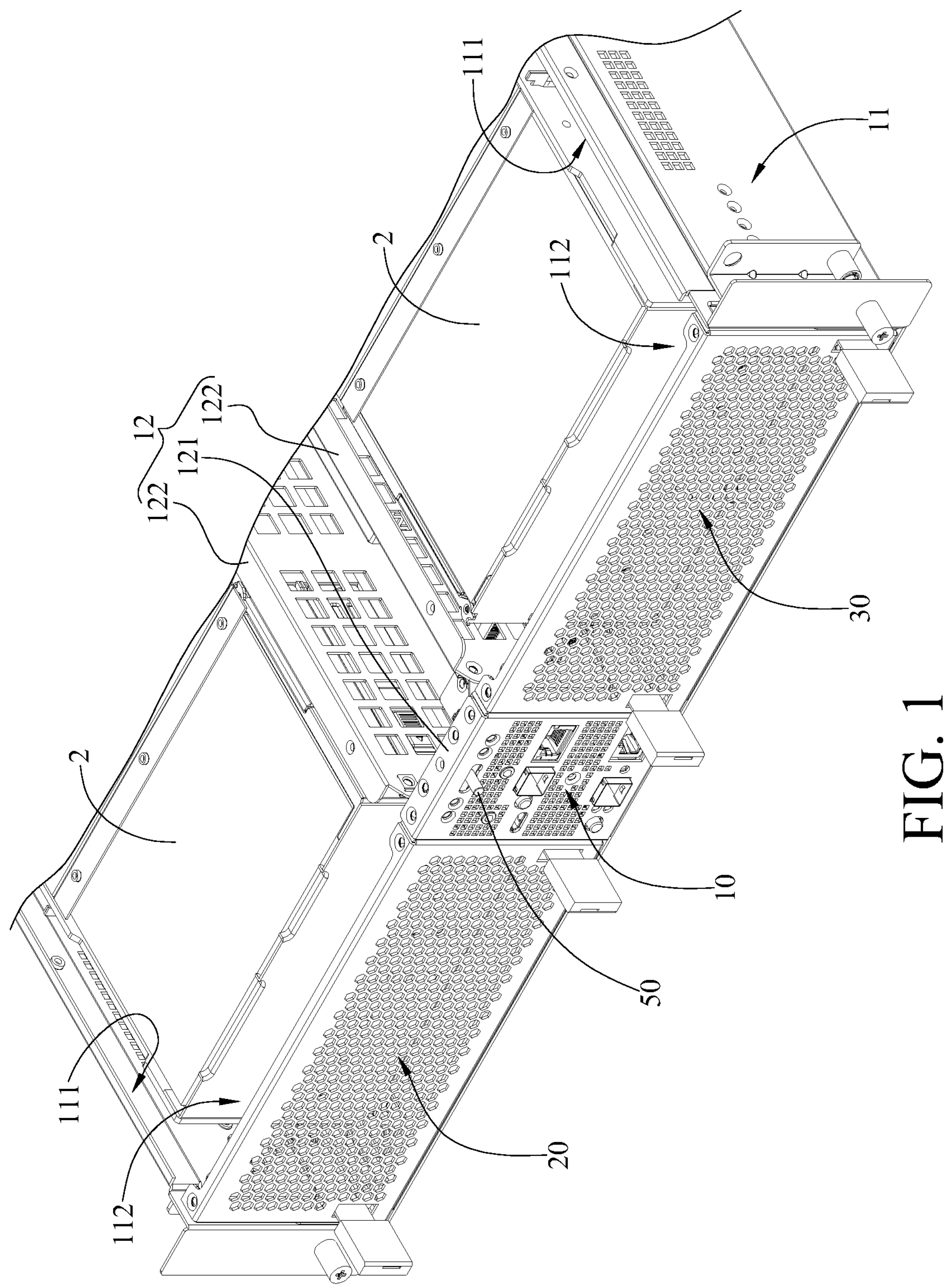
FIG. 1 is a partial perspective view of a server casing assembly according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present invention is not limited thereto. Furthermore, for the purpose of illustration, some of the structures and components in the figures are simplified, and wires, reference lines or buses are omitted in some of the figures.

Moreover, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
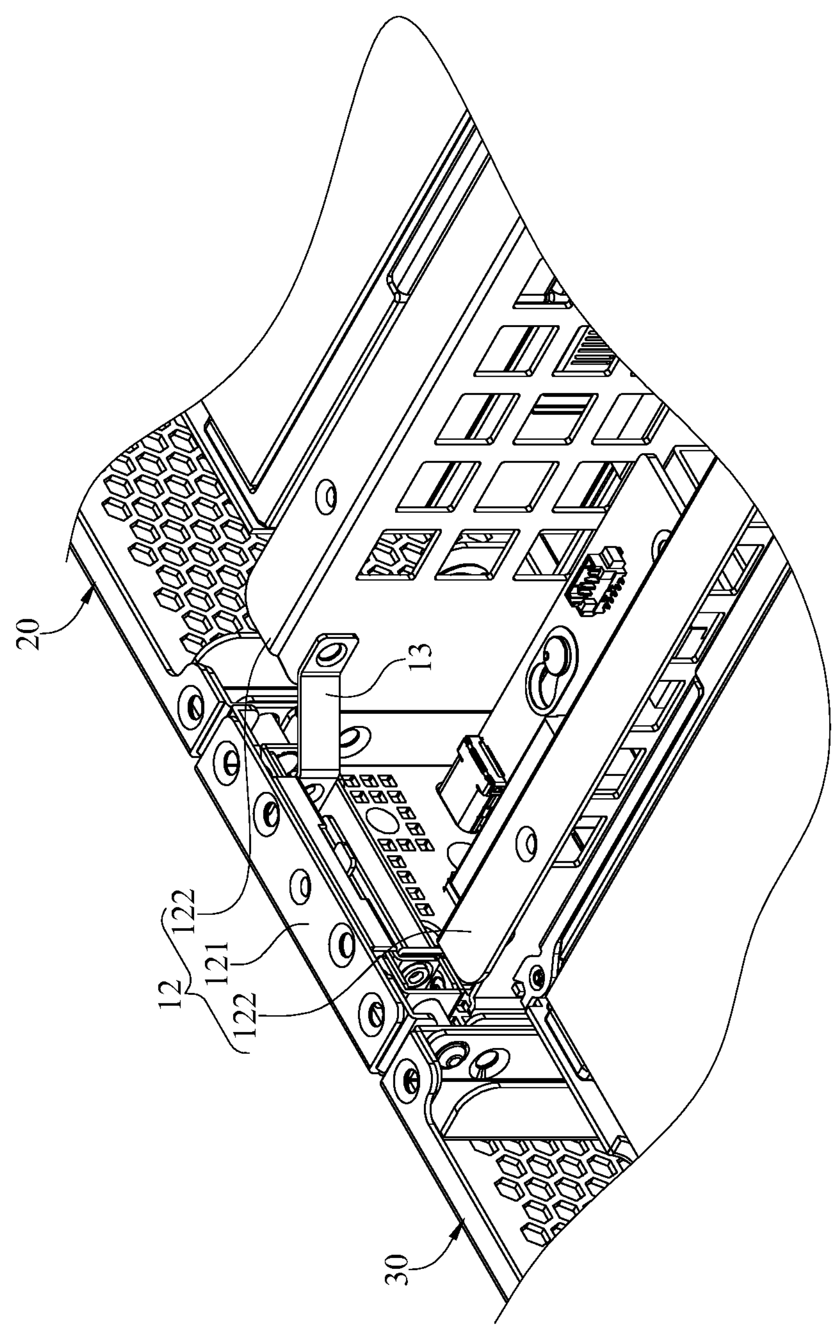
FIG. 2 is another partial perspective view of the server casing assembly in FIG. 1.
Figure 3:
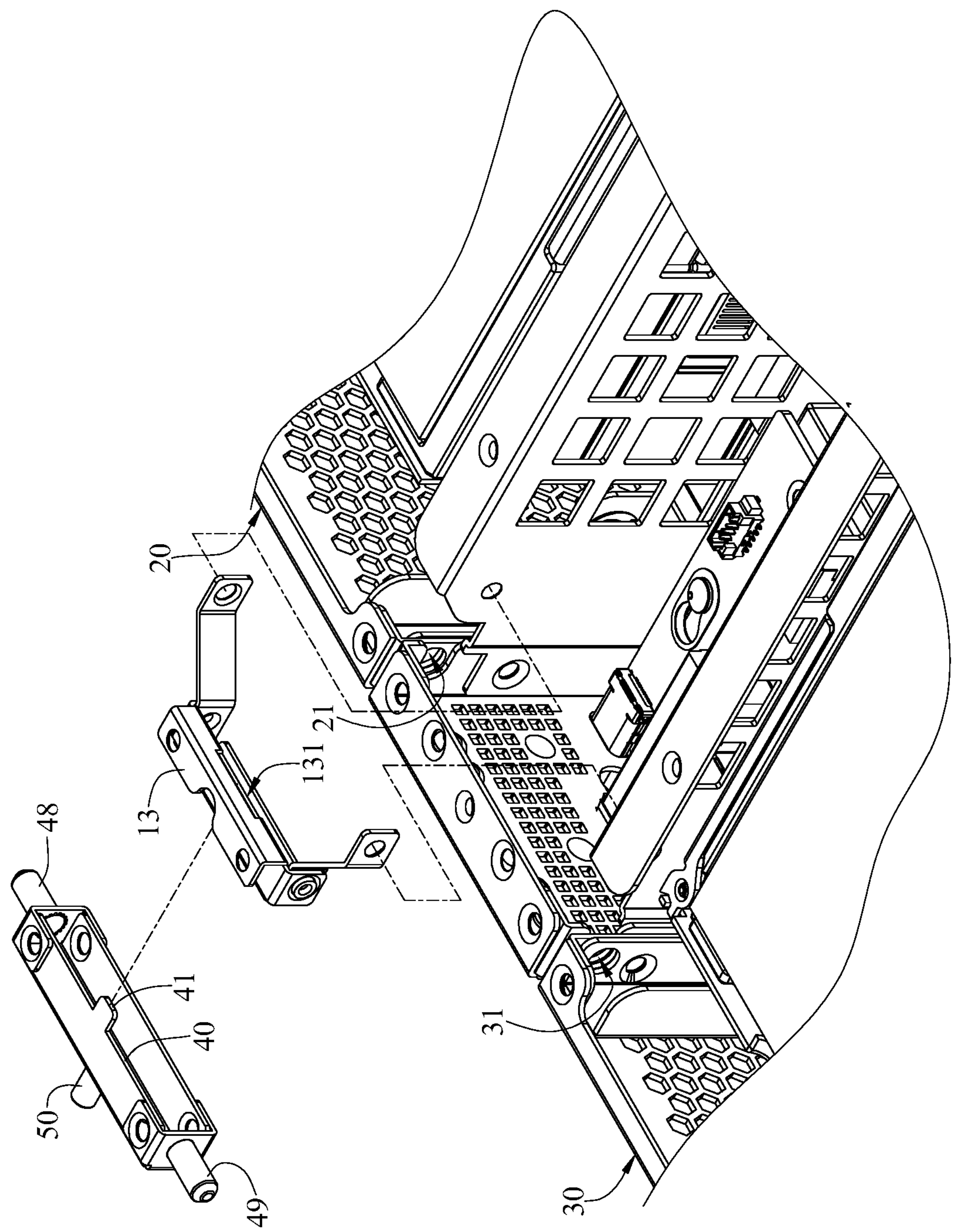
FIG. 3 is a partial exploded view of the server casing assembly in FIG. 2.
Figure 4:
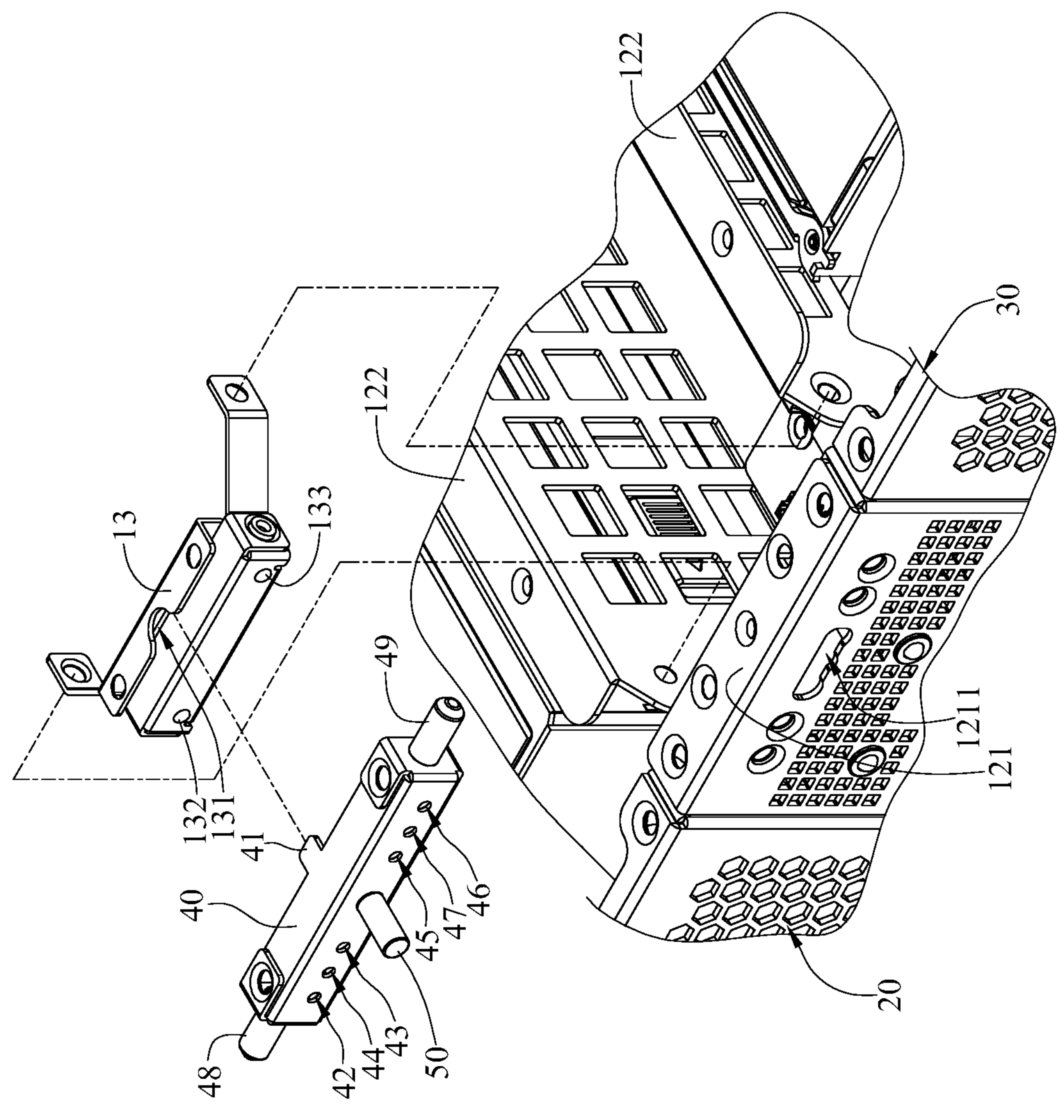
FIG. 4 is another partial exploded view of the server casing assembly in FIG. 2.

Referring to FIGS. 1 to 4, there are shown a partial perspective view of a server casing assembly 1 according to one embodiment of the invention, another partial perspective view of the server casing assembly 1 in FIG. 1, a partial exploded view of the server casing assembly 1 in FIG. 2, and another partial exploded view of the server casing assembly 1 in FIG. 2.

In this embodiment, the server casing assembly 1 includes a casing 10, a first cage 20, a second cage 30, a latch 40.

The casing 10 includes a tray 11, a partition 12, and a fastener 13. The partition 12 is fixed on the tray 11, and the partition 12 includes a front plate 121 and two side plates 122. The side plates 122 are respectively connected to two opposite sides of the front plate 121. The side plates 122 and two inner surfaces 111 of the tray 11 opposite to each other respectively form two accommodation spaces 112 that are spaced apart from each other. The fastener 13 is located between and fixed to the side plates 122, and the latch 40 is slidably located between the front plate 121 and the fastener 13.

In this embodiment, the fastener 13 has a guiding hole 131, and the latch 40 has a guiding protrusion 41. The guiding protrusion 41 of the latch 40 is slidably located in the guiding hole 131 of the fastener 13. As such, the guiding hole 131 limits the movement of the latch 40 in a desired direction. Note that the guiding hole 131 of the fastener 13 and the guiding protrusion 41 of the latch 40 are optional and not intended to limit the invention;

in some other embodiments, the fastener may have the guiding protrusion, and the latch may have a mating guiding hole. In another embodiment, the fastener may have no guiding hole, and the latch may have no guiding protrusion.

In this embodiment, the server casing assembly 1 may further include a handle 50, and the front plate 121 of the partition 12 may have an opening 1211. The handle 50 is disposed through the opening 1211 of the front plate 121 and fixed to the latch 40, and the handle 50 is movable in the opening 1211. As such, the latch 40 can be easily moved by operating the handle 50. Note that the handle 50 is optional and not intended to limit the invention; in some other embodiments, the server casing assembly may not include the handle 50, and the front plate of the partition may have the opening 1211.

In addition, the latch 40 may have a first positioning structure 42, a second positioning structure 43, a third positioning structure 44, a fourth positioning structure 45, a fifth positioning structure 46, and a sixth positioning structure 47. The first positioning structure 42, the second positioning structure 43, the third positioning structure 44, the fourth positioning structure 45, the fifth positioning structure 46, and the sixth positioning structure 47 are, for example, through holes. The first positioning structure 42, the second positioning structure 43, and the third positioning structure 44 are located at a side of the handle 50, and the fourth positioning structure 45, the fifth positioning structure 46, and the sixth positioning structure 47 are located at another side of the handle 50. The third positioning structure 44 is located between the first positioning structure 42 and the second positioning structure 43, and the second positioning structure 43 is located closer to the handle 50 than the third positioning structure 44. The sixth positioning structure 47 is located between the fourth positioning structure 45 and the fifth positioning structure 46, and the fourth positioning structure 45 is located closer to the handle 50 than the sixth positioning structure 47.

Furthermore, the fastener 13 further has two positioning portions 132 and 133. The positioning portions 132 and 133 are, for example, protrusions. The positioning portion 132 is configured to be selectively engaged with the first positioning structure 42, the second positioning structure 43, or the third positioning structure 44. The positioning portion 133 is configured to be selectively engaged with the fourth positioning structure 45, the fifth positioning structure 46, or the sixth positioning structure 47. The detail descriptions are given in later paragraphs.

In this embodiment, the first cage 20 and the second cage 30 are able to accommodate objects, such as hard disk drives 2. The first cage 20 and the second cage 30 are respectively located in the accommodation spaces 112 of the casing 10. The first cage 20 has an insertion hole 21, and the second cage 30 has an insertion hole 31. In addition, the latch 40 further has a first engagement portion 48 and a second engagement portion 49 located opposite to each other and protruding towards in opposite directions. The first engagement portion 48 and the second engagement portion 49 are respectively configured to be inserted into the insertion hole 21 of the first cage 20 and the insertion hole 31 of the second cage 30.

In this embodiment, the latch 40 is movable among a locked position, a first unlocked position, and a second unlocked position, where the locked position is located between the first unlocked position and the second unlocked position.

Figure 5:
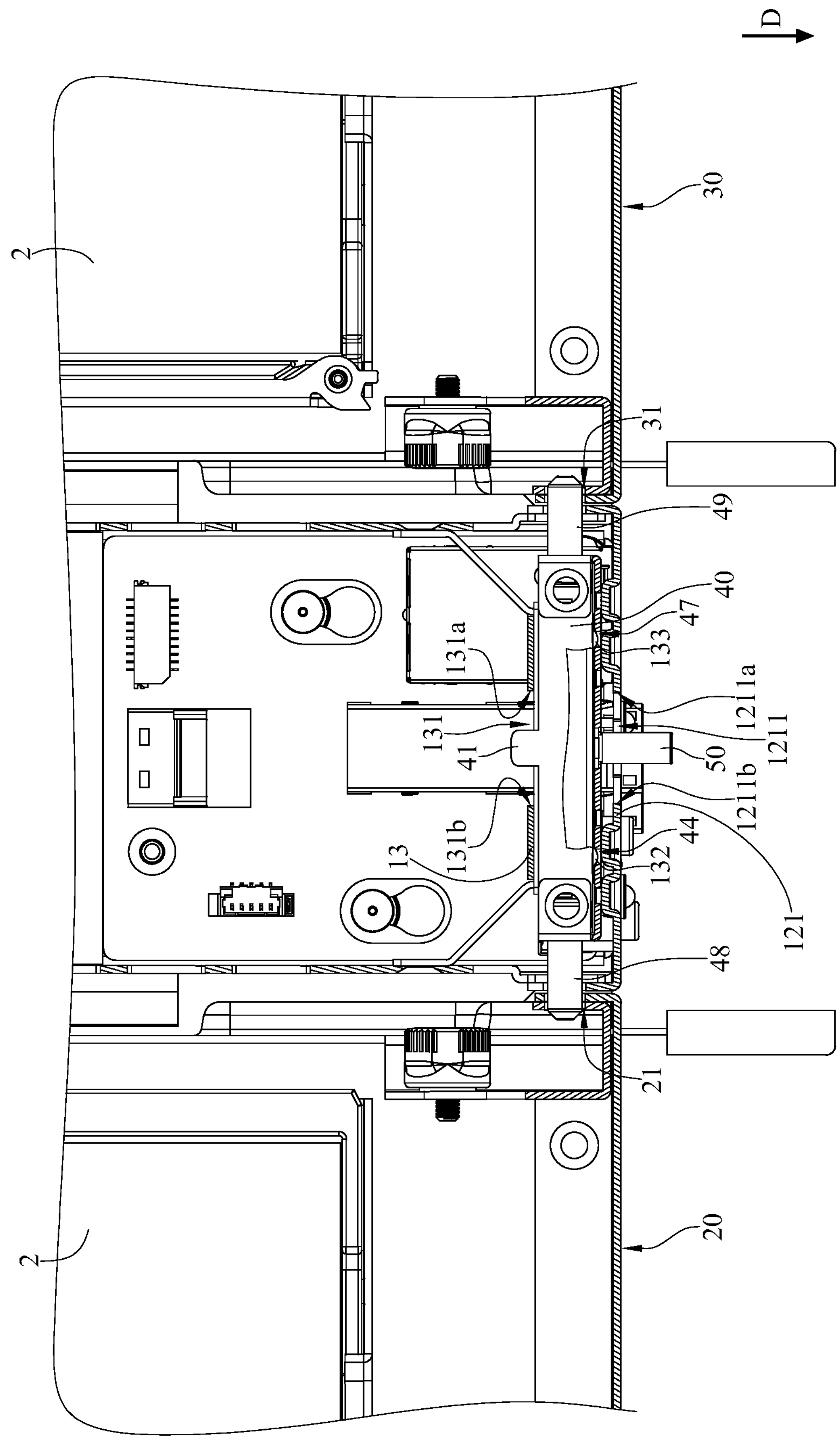
FIG. 5 is a partial cross-sectional view of the server casing assembly in FIG. 1.
Figure 6:
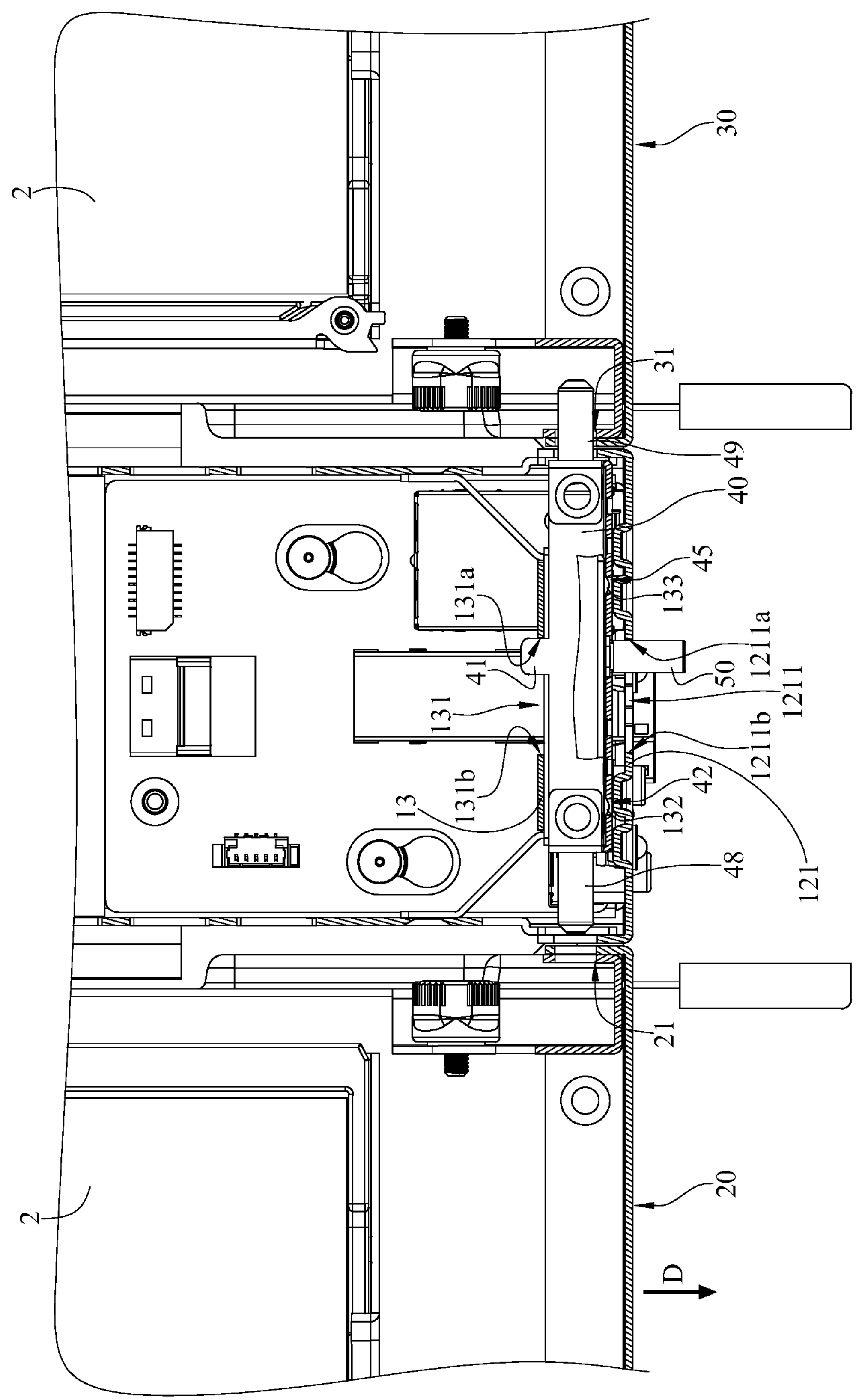
FIG. 6 is a partial cross-sectional view of the server casing assembly in FIG. 1 when the latch is in a first unlocked position.
Figure 7:
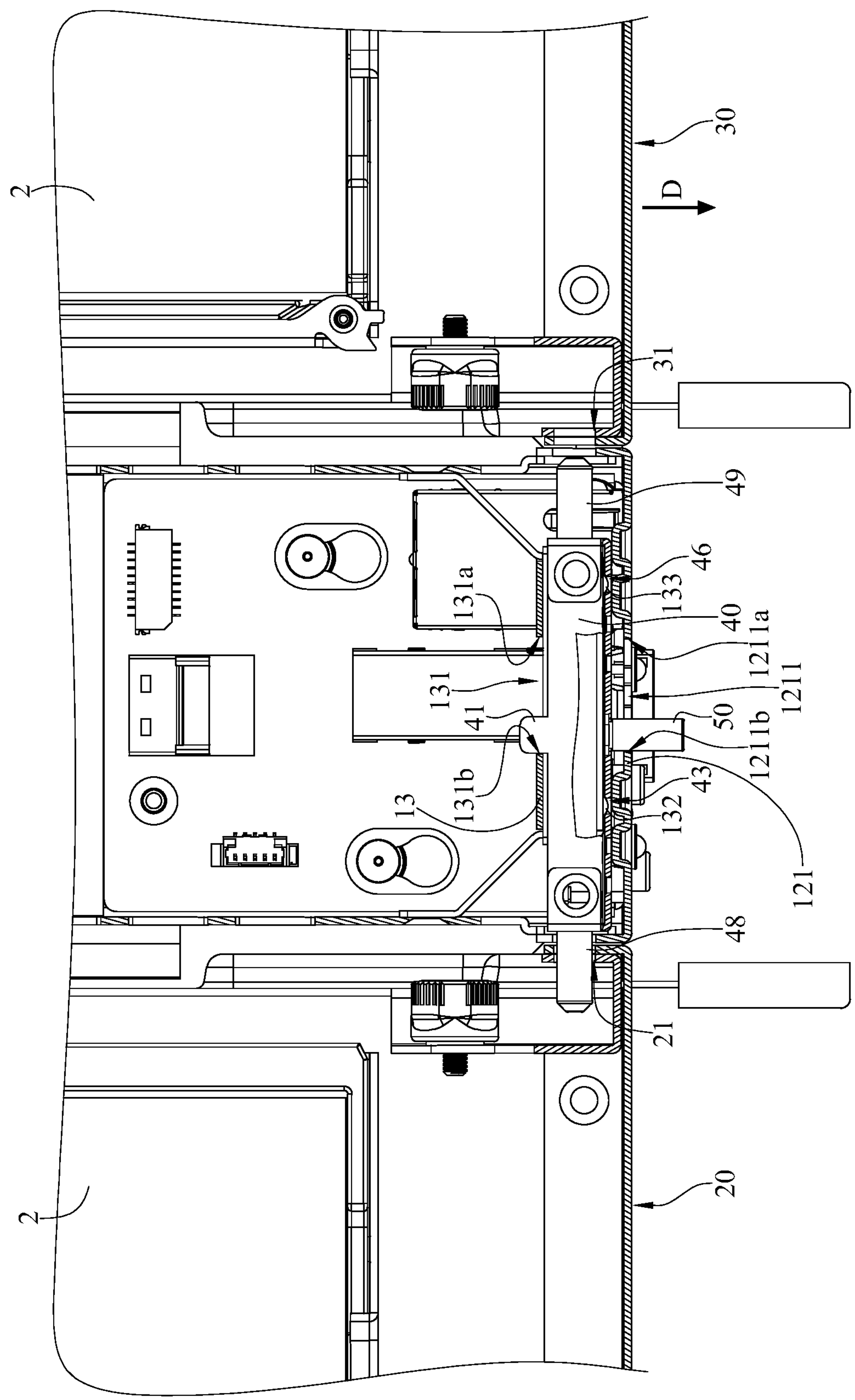
FIG. 7 is a partial cross-sectional view of the server casing assembly in FIG. 1 when the latch is in a second unlocked position.

Specifically, referring to FIGS. 5 to 7, there are shown a partial cross-sectional view of the server casing assembly 1 in FIG. 1, a partial cross-sectional view of the server casing assembly 1 in FIG. 1 when the latch 40 is in a first unlocked position, and a partial cross-sectional view of the server casing assembly 1 in FIG. 1 when the latch 40 is in a second unlocked position.

As shown in FIG. 5, when the latch 40 is in the locked position, the first engagement portion 48 and the second engagement portion 49 of the latch 40 are respectively inserted into the insertion hole 21 of the first cage 20 and the insertion hole 31 of the second cage 30, such that the latch 40 is engaged with the first cage 20 and the second cage 30 at the same time. At this moment, the latch 40 limits the movements of the first cage 20 and the second cage 30, such that the first cage 20 and the second caged 30 are prevented from moving out of the casing 10 (e.g., along the direction D), securing the current positions of the first cage 20 and the second cage 30 in the casing 10.

In addition, when the latch 40 is in the locked position, the handle 50 is located at the middle portion of the opening 1211 of the front plate 121; that is, the handle 50 is spaced apart from two opposite edges 1211*a* and 1211*b* in the opening 1211; the guiding protrusion 41 of the latch 40 is located at the middle portion of the guiding hole 131 of the fastener 13; that is, the guiding protrusion 41 is spaced apart from two opposite edges 131*a* and 131*b* in guiding hole 131; and the positioning portions 132 and 133 are respectively engaged with the third positioning structure 44 and the sixth positioning structure 47 of the latch 40.

To draw the first cage 20 out of the casing 10, the handle 50 can be moved towards the edge 1211*a* in the opening 1211 located away from the first cage 20 so as to switch the latch 40 to the first unlock position from the locked position. As shown in FIG. 6, when the latch 40 is in the first unlocked position, the handle 50 is located at the edge 1211*a* in the opening 1211 of the front plate 121 located away from the first cage 20, the guiding protrusion 41 of the latch 40 is located at the edge 131 a in the guiding hole 131 of the fastener 13 located away from the first cage 20, and the positioning portions 132 and 133 of the fastener 13 are respectively engaged with the first positioning structure 42 and the fourth positioning structure 45 of the latch 40. At this moment, the first engagement portion 48 of the latch 40 is removed from the insertion hole 21 of the first cage 20, and the second engagement portion 49 is still in the insertion hole 31 of the second cage 30. As such, the first cage 20 is released from the latch 40 and can be moved out of the casing 10 (e.g., along the direction D). Meanwhile, the latch 40 still holds the second cage 30 in place so that the second cage 30 is secured in the current position and not allowed to move.

On the other side, to draw the second cage 30 out of the casing 10, the handle 50 can be moved towards the edge 1211*b* in the opening 1211 located away from the second cage 30 so as to switch the latch 40 to the second unlocked position from the locked position. As shown in FIG. 7, when the latch 40 is in the second unlocked position, the handle 50 is located at the edge 1211*b* in the opening 1211 of the front plate 121 located away from the second cage 30, the guiding protrusion 41 of the latch 40 is located at the edge 131*b* in the guiding hole 131 of the fastener 13 located away from the second cage 30, and the positioning portions 132 and 133 of the fastener 13 are respectively engaged with the second positioning structure 43 and the fifth positioning structure 46 of the latch 40. At this moment, the second engagement portion 49 of the latch 40 is removed from the insertion hole 31 of the second cage 30, and the first engagement portion 48 is still in the insertion hole 21 of the first cage 20. As such, the second cage 30 is released from the latch 40 and can be moved out of the casing 10 (e.g., along the direction D). Meanwhile, the latch 40 still holds the first cage 20 in place so that the first cage 20 is secured in the current position and not allowed to move.

In this embodiment, either the latch 40 is in the first unlocked position or the second unlocked position, only one of the cages (the first cage 20 and the second cage 30) is released but the other is still held in place, that is, the above arrangement prevents user from moving both the first cage 20 and the second cage 30 out of the casing 10 at the same time, thereby preventing the whole server from falling forwards due to too much frontward motion of the overall center of gravity.

In addition, when the latch 40 is moved from one position to another, the positioning portions 132 and 133 are engaged with the corresponding positioning structures (i.e., two of the positioning structures 42, 43, 44, 45, 46, and 47) of the latch 40 so as to provide user with tactile feedback and help hold the latch 40 in the selected position, preventing the latch 40 from moving due to vibration or sudden impact.

Note that the types of the positioning portions 132 and 133 of the fastener 13 and the positioning structures 42, 43, 44, 45, 46, and 47 can be modified as required and not intended to limit the invention; in some other embodiment, the positioning portion of the fastener may be through holes, and the positioning structures of the latch may be protrusions.

In addition, the quantities of the positioning portions 132 and 133 of the fastener 13 and the positioning structures 42, 43, 44, 45, 46, and 47 of the latch 40 can be modified as required; in some other embodiment, the fastener may have only one positioning portion (e.g., the positioning portion 132 or the positioning portion 133), and the latch may only have three positioning structures (e.g., the positioning structures 42, 43, and 44, or the positioning structures 45, 46, and 47). In another embodiment, the fastener may have no positioning portion, and the latch may have no positioning structure.

As the server casing assemblies discussed in the above embodiments, either the latch is in the first unlocked position or the second unlocked position, only one of the cages (the first cage and the second cage) is released but the other is still held in place, that is, the above arrangement prevents user from moving both the first cage and the second cage out of the casing at the same time, thereby preventing the whole server from falling forwards due to too much frontward motion of the overall center of gravity.

In addition, when the latch is moved from one position to another, the positioning portions are engaged with the corresponding positioning structures of the latch 40 so as to provide user with tactile feedback and help hold the latch in the selected position, preventing the latch from moving due to vibration or sudden impact.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A server casing assembly, comprising:

a casing, having two accommodation spaces spaced apart from each other;

a first cage and a second cage, respectively accommodated in the accommodation spaces; and a latch, slidably disposed on the casing, wherein the latch is movable between a first unlocked position and a second unlocked position;

wherein when the latch is in the first unlocked position, the latch is engaged with the second cage, and the first cage is released from the latch; when the latch is in the second unlocked position, the latch is engaged with the first cage, and the second cage is released from the latch;

wherein the casing comprises a tray, a partition, and a fastener, the partition is fixed on the tray, the partition comprises a front plate and two side plates, the side plates are respectively connected to two opposite sides of the front plate, the side plates and two inner surfaces of the tray opposite to each respectively form the accommodation spaces, the fastener is located between the two side plates and fixed to the side plates, and the latch is slidably located between the front plate and the fastener.

2. The server casing assembly according to claim 1, wherein the fastener has at least one positioning portion, the latch has a first positioning structure and a second positioning structure; when the latch is in the first unlocked position, the at least one positioning portion is engaged with the first positioning structure; when the latch is in the second unlocked position, the at least one positioning portion is engaged with the second positioning structure.

3. The server casing assembly according to claim 2, wherein the latch further has a third positioning structure, the third positioning structure is located between the first positioning structure and the second positioning structure; when the latch is in a locked position located between the first unlocked position and the second unlocked position, the at least one positioning portion is engaged with the third positioning structure.

4. The server casing assembly according to claim 3, wherein the at least one positioning portion is a protrusion, and the first positioning structure, the second positioning structure, and the third positioning structure are through holes.

5. The server casing assembly according to claim 1, further comprising a handle, wherein the front plate of the partition has an opening, the handle is disposed through the opening of the front plate and fixed to the latch, and the handle is movable in the opening.

6. The server casing assembly according to claim 1, wherein the fastener has a guiding hole, the latch has a guiding protrusion, and the guiding protrusion is slidably located in the guiding hole.

7. The server casing assembly according to claim 1, wherein the latch has a first engagement portion and a second engagement portion opposite to each other, each of the first cage and the second cage has an insertion hole; when the latch is in the first unlocked position, the second engagement portion of the latch is inserted into the insertion hole of the second cage, and the first engagement portion of the latch is removed from the insertion hole of the first cage; when the latch is in the second unlocked position, the first engagement portion of the latch is inserted into the insertion hole of the first cage, and the second engagement portion of the latch is removed from the insertion hole of the second cage.

8. The server casing assembly according to claim 7, wherein when the latch is in a locked position located between the first unlocked position and the second unlocked position, the first engagement portion and the second engagement portion of the latch are respectively inserted into the insertion hole of the first cage and the insertion hole of the second cage.

9. The server casing assembly according to claim 1, wherein when the latch is in a locked position located between the first unlocked position and the second unlocked position, the latch is engaged with the first cage and the second cage.

* * * * *